(12) United States Patent
Tanaka et al.

(10) Patent No.: US 11,059,105 B2
(45) Date of Patent: Jul. 13, 2021

(54) SURFACE-COATED CUTTING TOOL

(71) Applicant: SUMITOMO ELECTRIC HARDMETAL CORP., Itami (JP)

(72) Inventors: Keizo Tanaka, Itami (JP); Makoto Setoyama, Itami (JP); Yutaka Kobayashi, Itami (JP); Akira Kobayashi, Itami (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 0 days.

(21) Appl. No.: 15/779,735

(22) PCT Filed: Sep. 20, 2017

(86) PCT No.: PCT/JP2017/033965
§ 371 (c)(1),
(2) Date: May 29, 2018

(87) PCT Pub. No.: WO2018/100849
PCT Pub. Date: Jun. 7, 2018

(65) Prior Publication Data
US 2019/0247930 A1   Aug. 15, 2019

(30) Foreign Application Priority Data

Nov. 29, 2016   (JP) ............................. JP2016-231723

(51) Int. Cl.
*B23B 27/14* (2006.01)
*C23C 14/06* (2006.01)
(Continued)

(52) U.S. Cl.
CPC ............ *B23B 27/148* (2013.01); *B23B 51/00* (2013.01); *B23F 21/00* (2013.01); *C23C 14/06* (2013.01);
(Continued)

(58) Field of Classification Search
CPC .......................... B32B 27/148; C23C 14/0641
(Continued)

(56) References Cited

U.S. PATENT DOCUMENTS

| | | | |
|---|---|---|---|
| 2007/0269610 A1 | 11/2007 | Fukui et al. | |
| 2015/0203956 A1* | 7/2015 | Asari | C23C 30/005 428/216 |
| 2018/0281078 A1* | 10/2018 | Hirano | B23B 51/00 |

FOREIGN PATENT DOCUMENTS

| | | |
|---|---|---|
| EP | 2336382 A1 | 6/2011 |
| JP | 2008-162009 A | 7/2008 |

(Continued)

*Primary Examiner* — Humera N. Sheikh
*Assistant Examiner* — Katherine A Christy
(74) *Attorney, Agent, or Firm* — Baker Botts L.L.P.; Michael A. Sartori

(57) ABSTRACT

Provided is a surface-coated cutting tool including a base material and a coating including a super-multilayer-structure layer where A layers and B layers different from the A layers in composition are alternately laminated. The super-multilayer-structure layer includes an X area and a Y area those are alternately repeated. In the X area, A layers having a thickness $A_X$ and B layers having a thickness $B_X$ are alternately laminated. In the Y area, A layers having a thickness $A_Y$ and B layers having a thickness $B_Y$ are alternately laminated. The thickness $A_X$ is larger than the thickness $A_Y$, and the thickness $B_X$ is smaller than the thickness $B_Y$. Each of the A layers and the B layers comprising one or more elements selected from a group consisting of Ti, Al, Cr, Si, Ta, Nb, and W, and one or more elements selected from a group consisting of C and N.

8 Claims, 7 Drawing Sheets

(51) Int. Cl.
*B23B 51/00* (2006.01)
*B23F 21/00* (2006.01)
(52) U.S. Cl.
CPC ...... *C23C 14/0641* (2013.01); *B23B 2222/28* (2013.01); *B23B 2224/08* (2013.01); *B23B 2224/24* (2013.01); *B23B 2228/08* (2013.01); *B23B 2228/105* (2013.01); *B23B 2228/24* (2013.01); *B23B 2228/36* (2013.01)
(58) Field of Classification Search
USPC .................................................. 428/697–699
See application file for complete search history.

(56) References Cited

FOREIGN PATENT DOCUMENTS

| | | |
|---|---|---|
| JP | 2011-083879 A | 4/2011 |
| JP | 2011-212786 A | 10/2011 |
| JP | 2013-176837 A | 9/2013 |
| WO | 2006/070730 A1 | 7/2006 |

* cited by examiner

SURFACE-COATED CUTTING TOOL

TECHNICAL FIELD

The present invention relates to a surface-coated cutting tool. The present application claims a priority based on Japanese Patent Application No. 2016-231723 filed on Nov. 29, 2016, the entire content of which is incorporated herein by reference.

BACKGROUND ART

As a cutting tool, there is known a surface-coated cutting tool which includes a base material having a coating on its surface and thereby exhibits characteristics of the base material and characteristics of the coating. For example, Japanese Patent Laying-Open No. 2013-176837 (PTD 1) discloses a surface-coated cutting tool including a hard material layer on a surface of a base material, the hard material layer including a plurality of sets of an AlCrN layer, a TiSiN layer, and an AlCrTiSiN layer laminated in a predetermined order.

In such a layer having a multilayer structure (multilayer-structure layer) in which two or more types of layers are repeatedly laminated, the layers are usually designed to have the same thickness from a viewpoint of homogeneity in characteristics, for example. However, there has also been another technique in which to provide a multilayer-structure layer including layers with varied thicknesses to provide distinctive characteristics that could not be exhibited by the same-thickness layers.

For example, WO 2006/070730 (PTD 2) discloses an alternating layer obtained by alternately laminating A layers excellent in oxidation resistance and B layers providing good adhesion to a coating, where the ratio $\lambda a/\lambda b$ of the A layer thickness $\lambda a$ to the B layer thickness $\lambda b$ continuously increases as the distance from a base material increases. PTD 2 discloses that the coating containing such an alternating layer is excellent in oxidation resistance, provides good adhesion to the coating, and can prevent crack extension, thus allowing a surface-coated cutting tool to have a long life.

Further, Japanese Patent Laying-Open No. 2008-162009 (PTD 3) discloses a coating having a multilayer structure composed of laminated two or more types of layers having different compositions, where the sequence of thicknesses of individual layers in the multilayer structure is irregular with no repetitive cycle. PTD 3 states that such a coating is excellent in abrasion resistance.

CITATION LIST

Patent Document

PTD 1: Japanese Patent Laying-Open No. 2013-176837
PTD 2: WO 2006/070730
PTD 3: Japanese Patent Laying-Open No. 2008-162009

SUMMARY OF INVENTION

A surface-coated cutting tool according to one aspect of the present disclosure is a surface-coated cutting tool including a base material and a coating covering a surface of the base material. The coating includes a super-multilayer-structure layer where A layers and B layers different from the A layers in composition are alternately laminated from the base material side to the surface side. The super-multilayer-structure layer has a construction in which an X area and a Y area are alternately repeated from the base material side to the surface side, the X area being an area where A layers having a thickness $A_X$ and B layers having a thickness $B_X$ are alternately laminated, the Y area being an area where A layers having a thickness $A_Y$ and B layers having a thickness $B_Y$ are alternately laminated. The thickness $A_X$ of the A layers is larger than the thickness $A_Y$ of the A layers, and the thickness $B_X$ of the B layers is smaller than the thickness $B_Y$ of the B layers. Each of the A layers and the B layers has a composition comprising one or more elements selected from a group consisting of Ti, Al, Cr, Si, Ta, Nb, and W, and one or more elements selected from a group consisting of C and N.

DESCRIPTION FOR CARRYING OUT THE INVENTION

Figure 1:
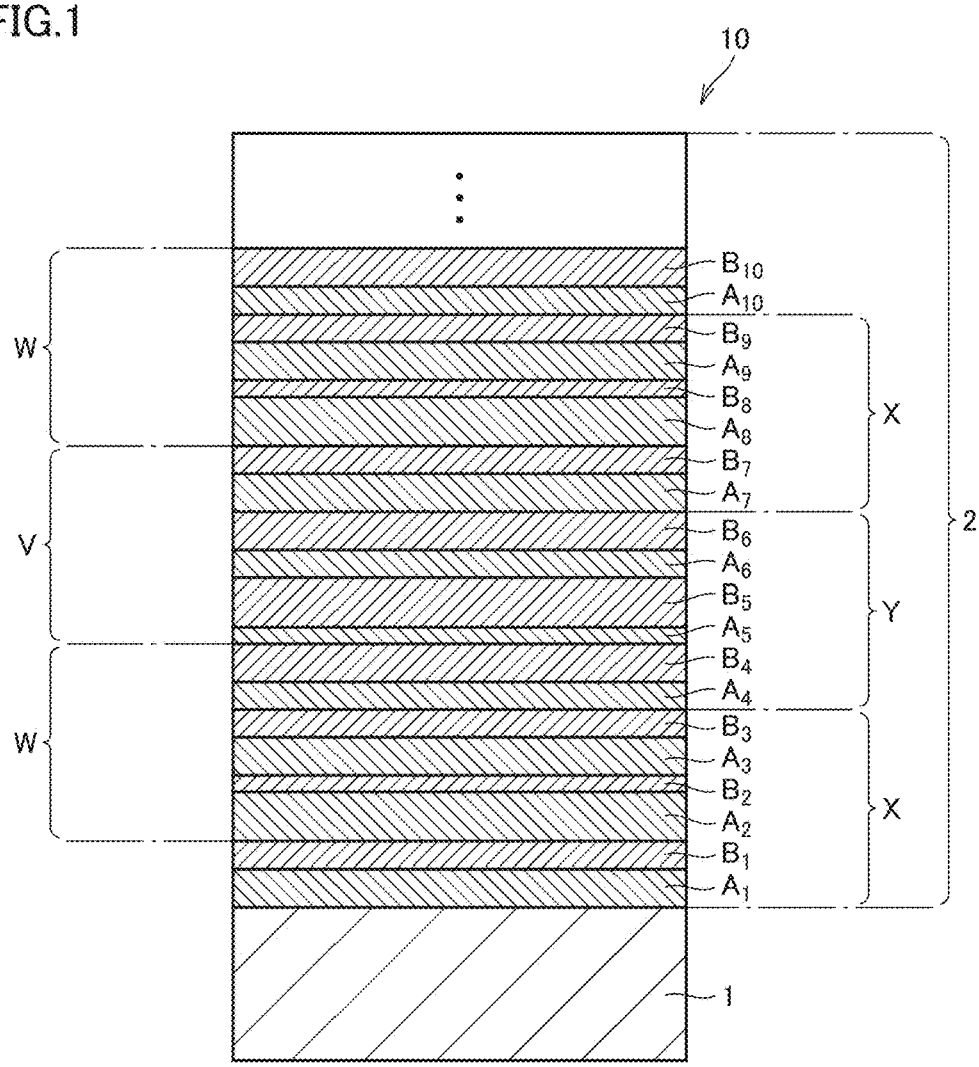
FIG. 1 is a cross-sectional view schematically showing a construction of a coating included in a surface-coated cutting tool in one embodiment.

Problem to be Solved by the Present Disclosure

A surface-coated cutting tool tends to have different damage morphologies depending on the portion. For example, in grinding with a throw away tip, a rake face and a flank face are significantly different from each other in damage morphology. In drilling with a drill, a groove portion near the rotating shaft of the drill and a peripheral cutting-edge portion remote from the rotating shaft are significantly different from each other in damage morphology.

Although conventional techniques can reduce a damage on a specific portion of a surface-coated cutting tool, it is actually difficult to sufficiently reduce damages having different morphologies on a plurality of portions. A surface-coated cutting tool will end its life when the working accuracy of a workpiece drops to less than or equal to a threshold value. Accordingly, if each of damages having different morphologies contained in one tool cannot be sufficiently reduced, then a working accuracy for a workpiece will be decreased and the tool life will be shortened. In other words, there is yet room for an increase in life of a surface-coated cutting tool.

An object of the present disclosure is to provide a surface-coated cutting tool having a long tool life.

Advantageous Effect of the Present Disclosure

According to the present disclosure, a surface-coated cutting tool having a long tool life can be provided.

Description of Embodiments of the Invention

First, embodiments of the present invention are enumerated. In this description, an expression in the form of "M to N" represents the upper and lower limits of a range (i.e., M to N both inclusive). M with no unit and only N with a unit means that M and N have the same unit.

(1) A surface-coated cutting tool according to one aspect of the present disclosure includes a base material, and a coating covering a surface of the base material. The coating includes a super-multilayer-structure layer where A layers and B layers different from the A layers in composition are alternately laminated from the base material side to the surface side. The super-multilayer-structure layer has a construction in which an X area and a Y area are alternately repeated from the base material side to the surface side, the X area being an area where A layers having a thickness $A_X$ and B layers having a thickness $B_X$ are alternately laminated, the Y area being an area where A layers having a thickness $A_Y$ and B layers having a thickness $B_Y$ are alternately laminated. The thickness $A_X$ of the A layers is larger than the thickness $A_Y$ of the A layers, and the thickness $B_X$ of the B layers is smaller than the thickness $B_Y$ of the B layers. Each of the A layers and the B layers has a composition comprising one or more elements selected from a group consisting of Ti, Al, Cr, Si, Ta, Nb, and W, and one or more elements selected from a group consisting of C and N.

The coating included in the surface-coated cutting tool has a super-multilayer-structure layer where A layers and B layers are alternately laminated. Accordingly, both characteristics based on the A layers and characteristics based on the B layers can be exhibited. Further, the super-multilayer-structure layer has a construction in which an X area and a Y area are alternately repeated, the X area being an area where A layers having thickness $A_X$ and B layers having thickness $B_X$ are alternately laminated, the Y area being an area where A layers having thickness $A_Y$ and B layers having thickness $B_Y$ are alternately laminated, where $A_X$>$A_Y$ and $B_X$<$B_Y$ are satisfied. Therefore, characteristics based on the X area and characteristics based on the Y area can also be exhibited.

Thus, the coating can exhibit many and various characteristics compared to a conventional one. Accordingly, if a specific damage easily occurs at one portion of a surface-coated cutting tool and another specific damage easily occurs at another portion, then the damages to the both portions can be appropriately reduced. Therefore, it is possible for the surface-coated cutting tool to have a long tool life.

(2) In the surface-coated cutting tool, on a coordinate system having a vertical axis representing the thickness and having a horizontal axis representing the distance from the base material for each layer constituting the super-multilayer-structure layer, a graph A obtained by putting plots of the A layers included in the super-multilayer-structure layer and by connecting the plots with a straight line shows a wavy pattern where a peak area and a valley area are alternately repeated, and a graph B obtained by putting plots of the B layers included in the super-multilayer-structure layer and by connecting the plots with a straight line shows a wavy pattern where a peak area and a valley area are alternately repeated. In the graph A, the A layers constituting the peak area are the A layers constituting the X area, and the A layers constituting the valley area are the A layers constituting the Y area. In the graph B, the B layers constituting the peak area are the B layers constituting the Y area, and the B layers constituting the valley area are the B layers constituting the X area. Such a feature prevents the interlayer peeling in the super-multilayer-structure layer.

(3) In the surface-coated cutting tool, an XY area composed of the X area and one Y area adjacent to the X area has a thickness of less than or equal to 300 nm. Such a feature more reliably prevents the interlayer peeling in the super-multilayer-structure layer.

(4) In the surface-coated cutting tool, an XY area composed of the X area and the one Y area adjacent to the X area includes the 4 to 10 A layers both inclusive and the 4 to 10 B layers both inclusive. Such a feature more reliably prevents the interlayer peeling in the super-multilayer-structure layer.

(5) In the surface-coated cutting tool, each of the A layers and the B layers has a thickness of 0.5 nm to 30 nm both inclusive. Such a feature more reliably prevents the interlayer peeling in the super-multilayer-structure layer.

(6) In the surface-coated cutting tool, the super-multilayer-structure layer has a thickness of 1 μm to 20 μm both inclusive. Such a feature can more remarkably provide the effects of the super-multilayer-structure layer.

(7) In the surface-coated cutting tool, each of the A layers is a compound layer containing Al, Cr, and N, and each of the B layers is a compound layer containing Al, Ti, Si, and N. In this case, the super-multilayer-structure layer has A layers having high oxidation resistance and B layers having high hardness. Therefore, it is possible for the super-multilayer-structure layer to have a particularly long tool life.

Details of Embodiments of the Invention

One embodiment of the present invention (hereinafter referred to as "this embodiment") will be described below. This embodiment, however, is not limited to the description below. Note that, in the drawings used for describing the embodiments below, identical reference characters denote identical or corresponding parts. Further, a compound expressed in a chemical formula without a specified atomic ratio in this description includes any conventionally known atomic ratio. The atomic ratio is not necessarily limited to within a stoichiometric range. For example, when reference is made to "AlCrN", the ratio of the number of atoms constituting AlCrN is not limited Al:Cr:N=0.5:0.5:1 but includes any conventionally known atomic ratio.

<Surface-coated Cutting Tool>

With reference to FIG. 1, a surface-coated cutting tool according to this embodiment (hereinafter also simply referred to as a "tool") is described. As shown in FIG. 1, a tool 10 includes a base material 1 and a coating 2 covering a surface of base material 1.

Tool 10 may have any shape and use. For example, it may be a drill, an end mill, an indexable insert for drilling, an indexable insert for end milling, an indexable insert for milling, an indexable insert for turning, a metal-slitting saw, a gear cutting tool, a reamer, a tap, and a tip for pin-milling for a crankshaft.

Tool 10 is not limited to the one whose whole body has a structure including base material 1 and coating 2 formed on base material 1, but may be the one having such a structure at only a part (such as a cutting-edge portion, in particular) of the tool. For example, only a cutting-edge portion of a base (support) may have such a structure. In such a case, the term "cutting-edge portion" is regarded as a cutting tool. In other words, if the structure occupies only a part of a cutting tool, the structure is referred to as a surface-coated cutting tool.

<<Base Material>>

Base material 1 forms a base of the shape of tool 10. Any conventionally known base material of this type may be used as base material 1. For example, base material 1 is preferably any one of a cemented carbide (such as a WC-based cemented carbide including a cemented carbide that contains Co or an additive carbonitride with Ti, Ta, and Nb in addition to WC), a cermet (containing TiC, TiN, and/or TiCN as a main component), a high-speed steel, ceramics (such as a titanium carbide, a silicon carbide, a silicon nitride, an aluminum nitride, and an aluminum oxide), a cubic boron nitride sintered body, and a diamond sintered body.

Among these base materials, it is preferred to choose a cemented carbide, and more particularly, a WC-based cemented carbide or a cermet (a TiCN-based cermet, in particular). This is because each of these base materials is excellent in balance between hardness and strength particularly under a high temperature and has excellent characteristics as a base material of a surface-coated cutting tool for such a use.

<<Coating>>

Coating 2 has a super-multilayer-structure layer. Although FIG. 1 shows a case where coating 2 consists of only a super-multilayer-structure layer composed of A layers and B layers, coating 2 may also include another layer. Examples of another layer include a primary layer disposed between base material 1 and a super-multilayer-structure layer, and a surface layer disposed over the super-multilayer-structure layer. Coating 2 may be formed on a part (such as a cutting-edge portion) or whole of a surface of base material 1.

Coating 2 may have any thickness, such as 1 to 20 μm. Coating 2 less than 1 μm in thickness would make it difficult to provide a super-multilayer-structure layer (described later) with a sufficient thickness and thus might fail to sufficiently exert the effects of the super-multilayer-structure layer. Further, such coating 2 might not be able to provide sufficient characteristics. Coating 2 more than 20 μm in thickness might cause peeling of coating 2 due to a large pressure applied during cutting.

The thickness of coating 2 can be determined in the following way. First, an arbitrary position of tool 10 is cut, and a sample including a cross section of coating 2 is prepared. For the preparation of the sample, a focused ion beam system or a cross section polisher may be used, for example. The prepared sample is then observed with a SEM or a TEM, and the magnification is adjusted so that the observed image contains the entire area of the coating in the thickness direction. The thickness is then measured at five or more points, and the mean value of them is determined as the thickness of coating 2. The thickness of other layers can be determined in the same way unless otherwise specified.

<<Layer Other than Super-Multilayer-Structure Layer>>

Coating 2 preferably has a surface layer that constitutes the outermost surface of coating 2, and the surface layer is preferably larger in lattice constant than the super-multilayer-structure layer. The super-multilayer-structure layer, which is produced by a PVD method described later, tends to include a compressive stress therein. A compressive stress remaining in the coating tends to reduce the resistance to peeling of the coating.

If the super-multilayer-structure layer has thereon a surface layer that has a larger lattice constant than the super-multilayer-structure layer, i.e., a surface layer that has a smaller compressive stress than the super-multilayer-structure layer, the compressive stress of the entire coating is mitigated (reduced). Therefore, the surface-coated cutting tool including a surface layer that has a larger lattice constant than the super-multilayer-structure would improve the resistance to peeling and would be able to further prolong the life. The lattice constant of each of the surface layer and the super-multilayer-structure layer can be measured by an X-ray diffraction using a θ-2θ method. Each lattice constant can also be measured by an electron diffraction method using incidental equipment for a TEM.

Further, coating 2 may include a primary layer between the super-multilayer-structure layer and base material 1 in order to enhance the adhesion between coating 2 and base material 1.

<<Super-Multilayer-Structure Layer>>

The super-multilayer-structure layer has a construction in which A layers and B layers different from A layers in composition are alternately laminated from the base material side (the side adjacent to base material 1) to the surface side (the side remote from the side adjacent to base material 1).

Each of the A layers and the B layers has a composition comprising one or more elements selected from a group consisting of Ti, Al, Cr, Si, Ta, Nb, and W; and one or more elements selected from a group consisting of C and N. Examples of specific compositions include AlCrN, AlTiN, TiSiN, TiNbN, TiWN, and AlTiSiN.

In particular, a super-multilayer-structure layer according to this embodiment is characterized by satisfying the following (1) and (2):

(1) an X area and a Y area are alternately repeated from the base material side to the surface side, the X area being an area where A layers having a thickness $A_X$ and B layers having a thickness $B_X$ are alternately laminated, the Y area being an area where A layers having a thickness $A_Y$ and B layers having a thickness $B_Y$ are alternately laminated; and (2) thickness $A_X$ of A layers is larger than thickness $A_Y$ of A layers, and thickness $B_X$ of B layers is smaller than thickness $B_Y$ of B layers.

Although FIG. 1 illustrates a case where the layer closest to the base material is an A layer, the construction of the super-multilayer-structure layer is not limited as such. The layer closest to the base material may be a B layer. Further, although FIG. 1 illustrates a case where the area closest to the base material is an X area, the construction of the super-multilayer-structure layer is not limited as such. The area closest to the base material may be a Y area. The same applies to the area closest to the surface.

Coating 2 containing a super-multilayer-structure layer satisfying the above (1) and (2) can exhibit both characteristics based on A layers and characteristics based on B layers. Further, coating 2 can also exhibit characteristics based on X areas and characteristics based on Y areas. Consequently, coating 2 can exhibit many and various characteristics compared to a conventional one.

Thus, unlike a conventional coating which would tend to cause a specific damage to one portion and would tend to cause another specific damage to another portion, tool 10 having coating 2 can appropriately reduce the damages to both portions. Therefore, it is possible for tool 10 to have a long tool life.

On the other hand, a multilayer-structure layer including layers having the same thickness as described in PTD 1, for example, would not be able to exhibit such various characteristics. Further, a multilayer-structure layer having an irregular cycle as described in PTD 3 would not be able to avoid unevenness among lots.

<<First Super-Multilayer-Structure Layer>>

With reference to FIG. 1 to FIG. 4, a first super-multilayer-structure layer, which is one example super-multilayer-structure layer according to this embodiment, will be specifically described.

The first super-multilayer-structure layer is characterized by satisfying the above (1) and (2), and by further satisfying the following (3) to (6):

(3) on a coordinate system having a vertical axis representing the thickness of each layer and having a horizontal axis representing the distance of each layer from the base material, a graph A obtained by putting plots of A layers included in the super-multilayer-structure layer and by connecting the plots with a straight line shows a wavy pattern where a peak area and a valley area are alternately repeated:

(4) in the same coordinate system, a graph B obtained by putting plots of B layers included in the super-multilayer-structure layer and by connecting the plots with a straight line shows a wavy pattern where a peak area and a valley area are alternately repeated:

(5) in graph A, the A layers constituting a peak area are the A layers constituting an X area, and the A layers constituting a valley area are the A layers constituting a Y area; and (6) in graph B, the B layers constituting a peak area are the B layers constituting a Y area, and the B layers constituting a valley area are the B layers constituting an X area.

The above (3) to (6) will now be specifically described with reference to FIG. 1 to FIG. 4. For the sake of explanation, among A layers, the A layer located closest to the base material is referred to as $A_1$ layer, and the A layers are referred to as $A_1$ layer, $A_2$ layer, $A_3$ layer, . . . $A_{10}$ layer in this order from the base material side to the surface side. Similarly, among B layers, the B layer located closest to the base material is referred to as $B_1$ layer, and the B layers are referred to as $B_1$ layer, $B_2$ layer, $B_3$ layer, . . . $B_{10}$ layer in this order from the base material side to the surface side.

Further, it is assumed that $A_1$ layer to $A_{10}$ layer have thicknesses of 3 nm, 4 nm, 3 nm, 2 nm, 1 nm, 2 nm, 3 nm, 4 nm, 3 nm, and 2 nm, respectively, and that $B_1$ layer to $B_{10}$ layer have thicknesses of 2 nm, 1 nm, 2 nm, 3 nm, 4 nm, 3 nm, 2 nm, 1 nm, 2 nm, and 3 nm, respectively.

Although FIG. 1 shows ten A layers and ten B layers, it is needless to say that, on $B_{10}$ layer, the top layer, there may be a laminated structure where A layers and B layers are laminated in this order (this is represented by dots in FIG. 1).

According to such an assumption, the first super-multilayer-structure layer includes A layers ($A_1$ to $A_3$ layers and $A_7$ to $A_9$ layers) having a thickness of 3 to 4 nm, and A layers ($A_4$ to $A_6$ layers and $A_{10}$ layer) having a thickness of 1 to 2 nm. Further, the first super-multilayer-structure layer includes B layers ($B_1$ to $B_3$ layers and $B_7$ to $B_9$ layers) having a thickness of 1 to 2 nm, and B layers ($B_4$ to $B_6$ layers and $B_{10}$ layer) having a thickness of 3 to 4 nm.

An area where $A_1$ to $A_3$ layers having a thickness of 3 to 4 nm and $B_1$ to $B_3$ layers having a thickness of 1 to 2 nm are alternately laminated as shown in FIG. 1, and an area where $A_7$ to $A_9$ layers having a thickness of 3 to 4 nm and $B_7$ to $B_9$ layers having a thickness of 1 to 2 nm are alternately laminated as shown in FIG. 1 are X areas. On the other hand, an area where $A_4$ to $A_6$ layers having a thickness of 1 to 2 nm and $B_4$ to $B_6$ layers having a thickness of 3 to 4 nm are alternately laminated as shown in FIG. 1 is a Y area. That is, the thickness of each of $A_1$ to $A_3$ layers and $A_7$ to $A_9$ layers constituting X areas is 3 nm or 4 nm, and the thickness of each of $A_4$ to $A_6$ layers constituting a Y area is 1 nm or 2 nm. The thickness of each of $B_1$ to $B_3$ layers and $B_7$ to $B_9$ layers constituting X areas is 1 nm or 2 nm, and the thickness of each of $B_4$ to $B_6$ layers constituting a Y area is 3 nm or 4 nm.

Thus, the first super-multilayer-structure layer has a construction in which an X area and a Y area are alternately repeated from the base material side to the surface side, the X area being an area where A layers having thickness $A_X$ and B layers having thickness $B_X$ are alternately laminated, the Y area being an area where A layers having thickness $A_Y$ and B layers having thickness $B_Y$ are alternately laminated. Further, thickness $A_X$ (3 nm and 4 nm) of the A layers constituting X areas is larger than thickness $A_Y$ (1 nm and 2 nm) of the A layers constituting Y areas, and thickness $B_X$ (1 nm and 2 nm) of the B layers constituting X areas is smaller than thickness $B_Y$ (3 nm and 4 nm) of the B layers constituting Y areas.

Figure 2:
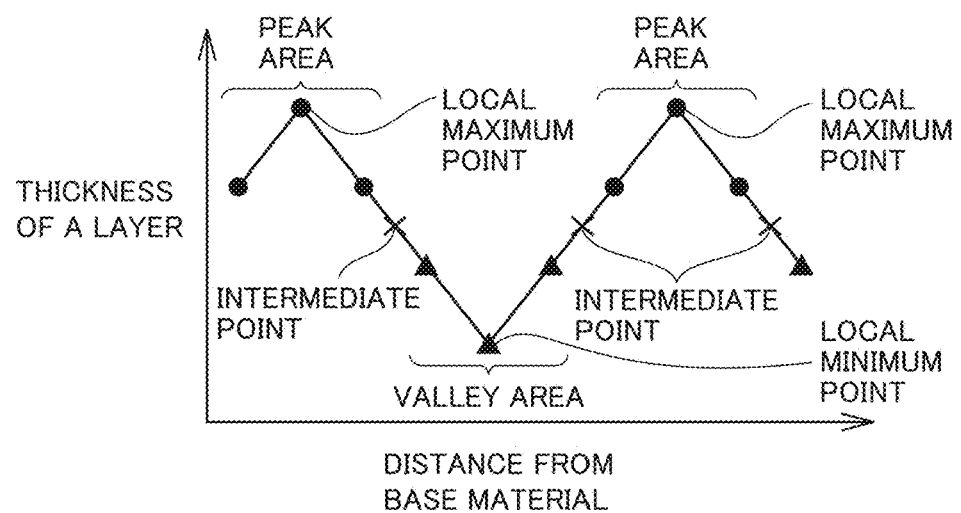
FIG. 2 is a graphic plot on a coordinate system having a vertical axis representing the thickness of each layer and having a horizontal axis representing the distance of each layer from a base material for A layers included in the super-multilayer-structure layer of FIG. 1.

First, the above (3) and (5) are described. Graph A, which is obtained by putting plots of $A_1$ to $A_{10}$ layers on a coordinate system and by connecting the plots with a straight line, the coordinate system having a vertical axis representing the thickness of each layer and having a horizontal axis representing the distance of each layer from the base material, shows a wavy pattern where a peak area and a valley area are alternately repeated as shown in FIG. 2. Note that the distance of each layer from the base material is defined as the distance between the intermediate position of the base material and the intermediate position of each layer in the thickness direction.

More specifically, six layers, $A_1$ to $A_3$ layers and $A_7$ to $A_9$ layers, are the A layers constituting peak areas, and four layers, $A_4$ to $A_6$ layers and $A_{10}$ layer, are the A layers constituting valley areas. As can be seen from FIG. 2, "peak areas" in graph A refer to areas where the thickness continuously increases from an intermediate point to a local maximum point and then continuously decreases to the next intermediate point, and "valley areas" refer to areas where the thickness continuously decreases from an intermediate point to a local minimum point and then continuously increases to the next intermediate point.

The intermediate point refers to a point having a value that is intermediate between the value of the local maximum point and the value of the local minimum point adjacent to the local maximum point. In this embodiment, in order to facilitate the understanding (i.e., in order to avoid complication of the drawing), the drawing shows a case where three intermediate points have the same value, i.e., the intermediate point (2.5 nm) between 4 nm (local maximum point) and 1 nm (local minimum point). However, the intermediate points may have different values. The same applies to graph B described later.

Next, the above (4) and (6) are described. Graph B, which is obtained by putting plots of $B_1$ to $B_{10}$ layers on a coordinate system and by connecting the plots with a straight line, the coordinate system having a vertical axis representing the thickness of each layer and having a horizontal axis representing the distance of each layer from the base material, shows a wavy pattern where a peak area and a valley area are alternately repeated as shown in FIG. 3.

More specifically, six layers, $B_1$ to $B_3$ layers and $B_7$ to $B_9$ layers, are the B layers constituting valley areas, and four layers, $B_4$ to $B_6$ layers and $B_{10}$ layer, are the B layers constituting peak areas. As can be seen from FIG. 3, "peak areas" in graph B refer to areas where the thickness continuously increases from an intermediate point to a local maximum point and then continuously decreases to the next intermediate point, and "valley areas" refer to areas where the thickness continuously decreases from an intermediate point to a local minimum point and then continuously increases to the next intermediate point. The method for determining an intermediate point is the same as that of graph A.

FIG. 2 being observed from another angle, A layers can also be described as having an area where the thickness continuously increases and an area where the thickness continuously decreases from the base material side to the surface side, the areas being alternately repeated. Further, FIG. 3 being observed from another angle, B layers can also be described as having an area where the thickness continuously increases and an area where the thickness continuously decreases from the base material side to the surface side, the areas being alternately repeated.

Figure 3:
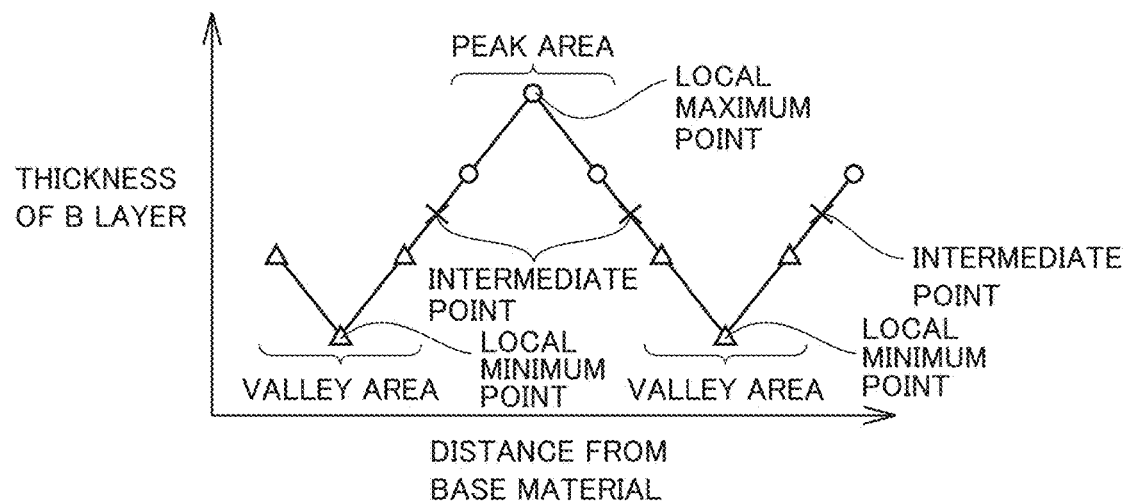
FIG. 3 is a graphic plot on a coordinate system having a vertical axis representing the thickness of each layer and having a horizontal axis representing the distance of each layer from the base material for B layers included in the super-multilayer-structure layer of FIG. 1.
Figure 4:
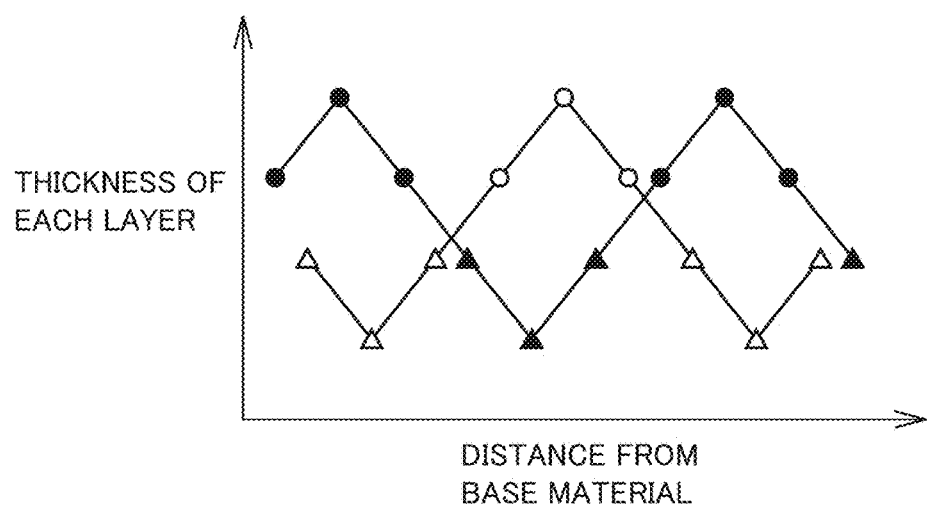
FIG. 4 is a graphic plot on a coordinate system having a vertical axis representing the thickness of each layer and having a horizontal axis representing the distance of each layer from the base material for A layers and B layers included in the super-multilayer-structure layer of FIG. 1.

FIG. 4 is a graph obtained by superimposing FIG. 2 and FIG. 3 on each other. FIG. 4 shows that, in the first super-multilayer-structure layer, in the areas in which the thickness of A layer continuously increases from the base material side to the surface side, the thickness of B layer continuously decreases from the base material side to the surface side, whereas in the areas in which the thickness of A layer continuously decreases from the base material side to the surface side, the thickness of B layer continuously increases from the base material side to the surface side. Therefore, it can be said that a change in thickness of A layer and a change in thickness of B layer are relative to each other.

The first super-multilayer-structure layer can then be defined as:

having a construction in which A layers and B layers different from the A layers in composition are alternately laminated from the base material side to the surface side; and having a construction in which a V area and a W area are alternately repeated from the base material side to the surface side, in the V area, the thickness of A layer continuously increasing from the base material side to the surface side, and the thickness of B layer continuously decreasing from the base material side to the surface side, in the W area, the thickness of A layer continuously decreasing from the base material side to the surface side, and the thickness of B layer continuously increasing from the base material side to the surface side.

The fact that coating 2 includes the first super-multilayer-structure layer that satisfies the above (1) to (6) can be checked as follows. First, a sample prepared in a way similar to the above-described way using a scanning transmission electron microscopy (STEM) is observed with a magnification of 200,000 times or more and thus a high-angle annular dark-field (HAADF) image is obtained.

Figure 5:
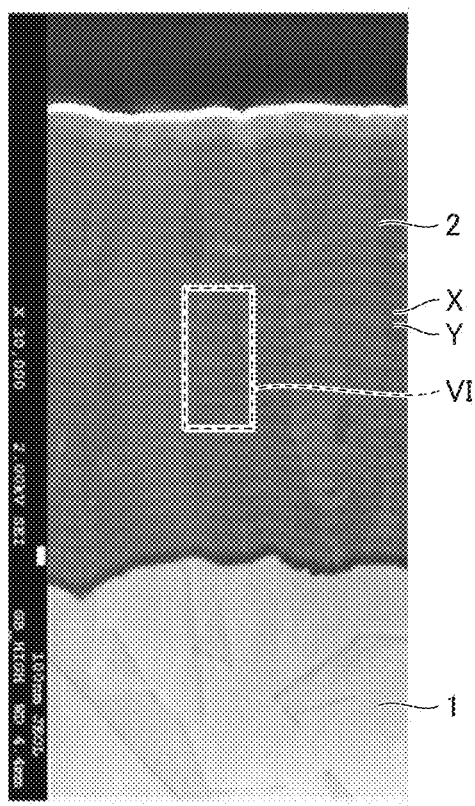
FIG. 5 is a photograph as a substitute for a drawing that has captured a microscope image of a super-multilayer-structure layer.
Figure 6:
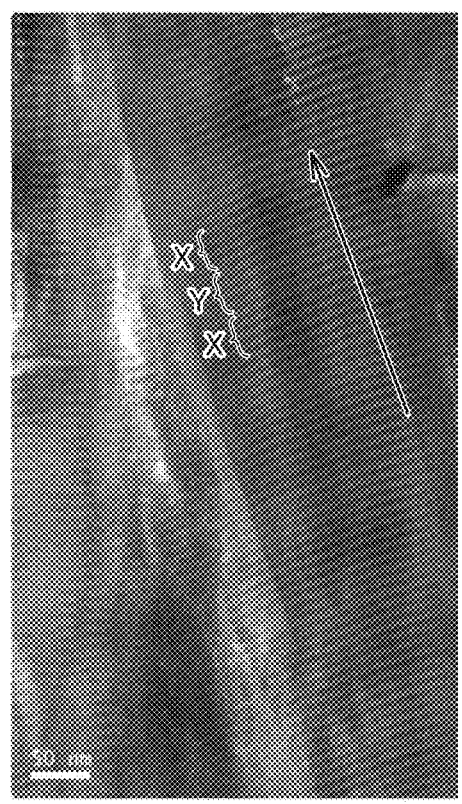
FIG. 6 is a photograph as a substitute for a drawing showing the part enclosed by a broken line in FIG. 5 in an enlarged view.

FIG. 5 is a photograph as a substitute for a drawing that has captured a microscope image of a super-multilayer-structure layer. FIG. 6 is a photograph as a substitute for a drawing showing the part enclosed by a broken line in FIG. 5 in an enlarged view. In FIG. 5, repetition of X areas and Y areas of the super-multilayer-structure layer is observed. In FIG. 6, a multilayer structure within each X area and a multilayer structure within each Y area are further observed.

More specifically, the super-multilayer-structure layer of FIG. 5 includes A layers composed of AlCrN and B layers composed of AlTiSiN. In a HAADF image, A layers having a small formula weight (the total of the atomic weights of the constituent elements) are observed as a dark hue (black), whereas B layers having a large formula weight are observed as a light hue (gray or white). Then, as shown in FIG. 5, X areas containing relatively thick A layers are observed as a relatively dark hue, whereas Y areas containing relatively thin A layers are observed as a relatively light hue. Further, by observing the super-multilayer-structure layer of FIG. 5 at a higher magnification, it is observed that each of X areas and Y areas has a structure where a plurality of dark-colored areas (A layers) and a plurality of light-colored areas (B layers) are laminated as shown in FIG. 6.

From the obtained HAADF image, an intensity profile (Z contrast) in the thickness direction (the direction indicated by the arrow in FIG. 6) of the super-multilayer-structure layer is obtained. Based on the obtained intensity profile, a graph is created on a coordinate system having a vertical axis representing the strength and having a horizontal axis representing the distance from a measurement starting point. The strength of the Z contrast is proportional to the square of the atomic weight. Accordingly, A layers composed of AlCrN and B layers composed of AlTiSiN can be distinguished from each other based on the contrast intensity profile.

Figure 7:
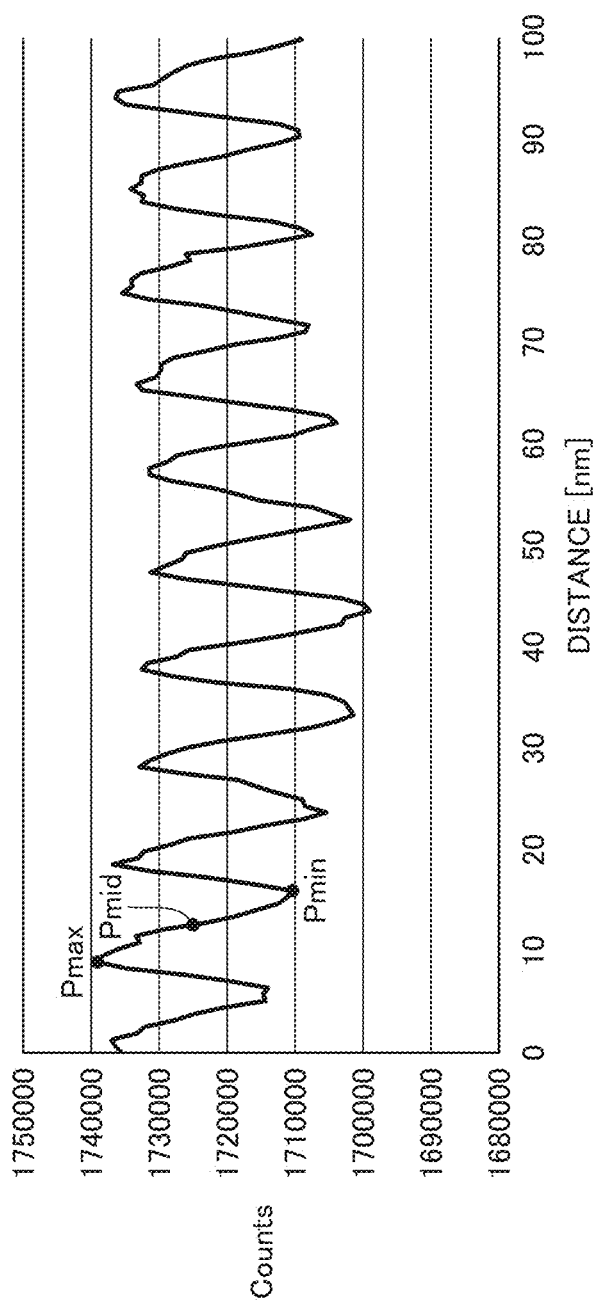
FIG. 7 is a graph showing a contrast intensity profile in the direction of the arrow in the microscope image shown in FIG. 6.

FIG. 7 is a graph showing a contrast intensity profile in the direction of the arrow in the microscope image (HAADF image) shown in FIG. 6. A layers composed of AlCrN and B layers composed of AlTiSiN being compared with each other, A layers contain the atom having the highest atomic weight (Cr). Therefore, A layers show a higher strength than B layers. Thus, the areas presenting a convex shape in FIG.

7 can be regarded as A layers, and the areas presenting a concave shape in FIG. 7 can be regarded as B layers. Further, the intermediate point $P_{mid}$ between the local maximum point $P_{max}$ in one convex area and the local minimum point $P_{min}$ in one concave area adjacent to the convex area is determined as a boundary between the convex area and the concave area (i.e., the boundary between an A layer and a B layer). The same applies to other boundaries.

The boundaries between A layers and B layers are thus determined, and the thickness of each A layer and the thickness of each B layer can be accordingly determined. The determination of the thickness of each layer can determine X areas and Y areas that are distinguished from each other by the thickness of each layer. The fact that A layers and B layers are alternately laminated and that X areas and Y areas are alternately repeated can also be checked by the light and shade of the HAADF image as described above. Further, based on the result of the thickness of each layer, graph A and graph B can be created.

Figure 8:
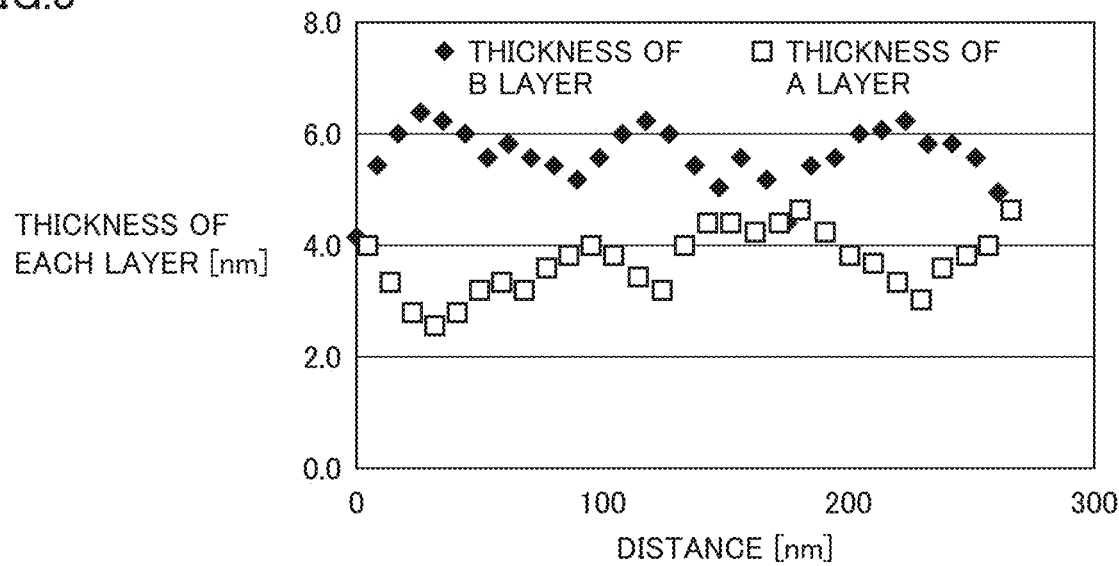
FIG. 8 is a graphic plot on a coordinate system having a vertical axis representing the thickness of each layer and having a horizontal axis representing the distance from a measurement starting point for A layers and B layers included in the super-multilayer-structure layer, based on the intensity profile of FIG. 7.

FIG. 8 is a graphic plot on a coordinate system having a vertical axis representing the thickness of each layer and having a horizontal axis representing the distance from a measurement starting point for A layers and B layers included in the super-multilayer-structure layer, based on the intensity profile of FIG. 7. Graph A is obtained by connecting the hollow-square plots of FIG. 8 with a straight line, and graph B is obtained by connecting the black-rhombus plots of FIG. 8 with a straight line. The graph of FIG. 8 shows that, in the super-multilayer-structure layer of FIG. 5, A layers have a thickness of about 2 to 5 nm, B layers have a thickness of about 4 to 7 nm, and B layers tend to be larger than A layers in thickness as a whole.

In this way, the fact that the super-multilayer-structure layer satisfies the above (1) to (6) can be checked. The composition of each layer can be checked by analyzing the above HAADF image using EDX equipment incidental to a TEM. At this time, the spot diameter is set to 1 nm, and the algebraic mean value of compositional ratios obtained at five randomly-selected points in each layer is defined as a composition.

The first super-multilayer-structure layer described above in detail can exhibit both characteristics based on A layers and characteristics based on B layers. Further, the first super-multilayer-structure layer can also exhibit characteristics based on X areas and characteristics based on Y areas. Consequently, coating 2 can exhibit many and various characteristics compared to a conventional one.

In particular, the first super-multilayer-structure layer is characterized in that the thickness of A layer repeats continuous increase and decrease from the base material side to the surface side, and in that the thickness of B layer repeats continuous increase and decrease from the base material side to the surface side. A super-multilayer-structure layer having such a construction prevents interlayer peeling more sufficiently. A conceivable reason is that a gentle change of each layer thickness in the thickness direction of the super-multilayer-structure layer can maintain a small stress difference between the layers. Therefore, the first super-multilayer-structure layer has a remarkably long tool life.

<<Second Super-Multilayer-Structure Layer>>

With reference to FIG. 9 to FIG. 12, a second super-multilayer-structure layer, which is another example super-multilayer-structure layer according to this embodiment, will be specifically described.

The second super-multilayer-structure layer satisfies the above (1) to (6). However, the second super-multilayer-structure layer is different from the first super-multilayer-structure layer in the shape of each "peak area" and "valley area" in graph A, and in the shape of each "peak area" and "valley area" in graph B.

For the sake of explanation, among A layers, the A layer located closest to the base material is referred to as $A_1$ layer, and the A layers are referred to as $A_1$ layer, $A_2$ layer, $A_3$ layer, ... $A_{10}$ layer in this order from the base material side to the surface side. Similarly, among B layers, the B layer located closest to the base material is referred to as $B_1$ layer, and the B layers are referred to as $B_1$ layer, $B_2$ layer, $B_3$ layer, ... $B_{10}$ layer in this order from the base material side to the surface side. Further, it is assumed that $A_1$ layer to $A_{10}$ layer have thicknesses of 4 nm, 4 nm, 4 nm, 1 nm, 1 nm, 1 nm, 4 nm, 4 nm, 4 nm, and 1 nm, respectively, and that $B_1$ layer to $B_{10}$ layer have thicknesses of 1 nm, 1 nm, 1 nm, 4 nm, 4 nm, 4 nm, 1 nm, 1 nm, 1 nm, and 4 nm, respectively.

Figure 9:
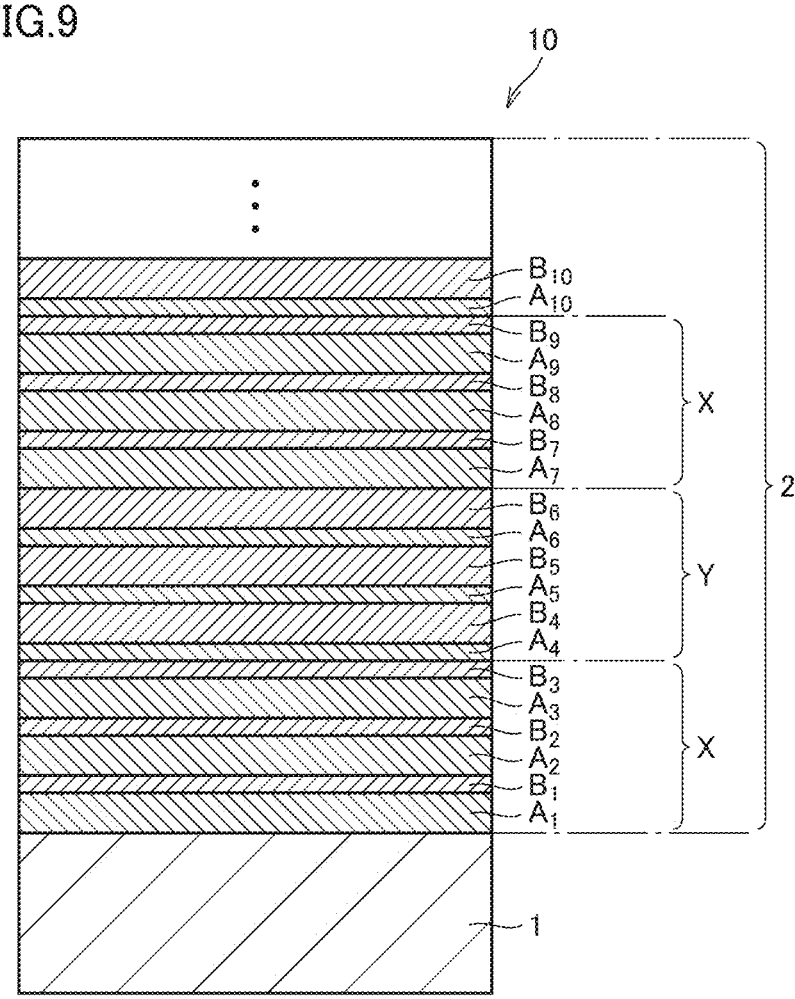
FIG. 9 is a cross-sectional view schematically showing another construction of a coating included in a surface-coated cutting tool in one embodiment.

Although FIG. 9 shows ten A layers and ten B layers, it is needless to say that, on $B_{10}$ layer, the top layer, there may be a laminated structure where A layers and B layers are laminated in this order (this is represented by dots in FIG. 9).

According to such an assumption, the second super-multilayer-structure layer includes A layers ($A_1$ to $A_3$ layers and $A_7$ to $A_9$ layers) having a thickness of 4 nm, and A layers ($A_4$ to $A_6$ layers and $A_{10}$ layer) having a thickness of 1 nm. Further, the second super-multilayer-structure layer includes B layers ($B_1$ to $B_3$ layers and $B_7$ to $B_9$ layers) having a thickness of 1 nm, and B layers ($B_4$ to $B_6$ layers and $B_{10}$ layer) having a thickness of 4 nm.

An area where $A_1$ to $A_3$ layers having a thickness of 4 nm and $B_1$ to $B_3$ layers having a thickness of 1 nm are alternately laminated as shown in FIG. 9, and an area where $A_7$ to $A_9$ layers having a thickness of 4 nm and $B_7$ to $B_9$ layers having a thickness of 1 nm are alternately laminated as shown in FIG. 9 are X areas. On the other hand, an area where $A_4$ to $A_6$ layers having a thickness of 1 nm and $B_4$ to $B_6$ layers having a thickness of 4 nm are alternately laminated as shown in FIG. 9 is a Y area. That is, the thickness of each of $A_1$ to $A_3$ layers and $A_7$ to $A_9$ layers constituting X areas is 4 nm, and the thickness of each of $A_4$ to $A_6$ layers constituting a Y area is 1 nm. The thickness of each of $B_1$ to $B_3$ layers and $B_7$ to $B_9$ layers constituting X areas is 1 nm, and the thickness of each of $B_4$ to $B_6$ layers constituting a Y area is 4 nm.

Thus, the second super-multilayer-structure layer has a construction in which an X area and a Y area are alternately repeated from the base material side to the surface side, the X area being an area where A layers having thickness $A_X$ and B layers having thickness $B_X$ are alternately laminated, the Y area being an area where A layers having thickness $A_Y$ and B layers having thickness $B_Y$ are alternately laminated. Further, thickness $A_X$ (4 nm) of the A layers constituting X areas is larger than thickness $A_Y$ (1 nm) of the A layers constituting Y areas, and thickness $B_X$ (1 nm) of the B layers constituting X areas is smaller than thickness $B_Y$ (4 nm) of the B layers constituting Y areas.

Figure 10:
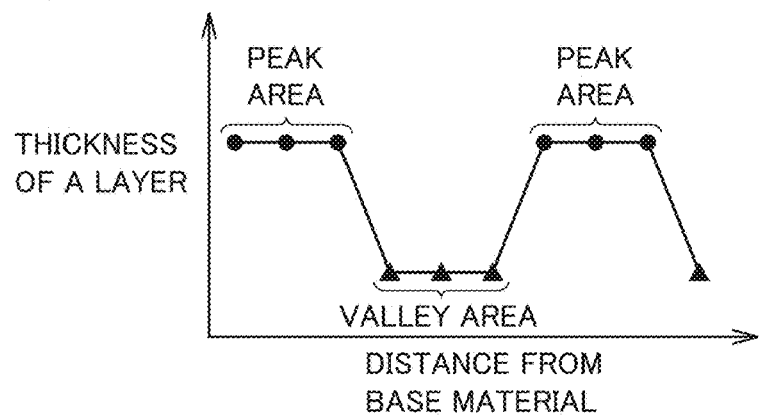
FIG. 10 is a graphic plot on a coordinate system having a vertical axis representing the thickness of each layer and having a horizontal axis representing the distance of each layer from a base material for A layers included in the super-multilayer-structure layer of FIG. 9.
Figure 11:
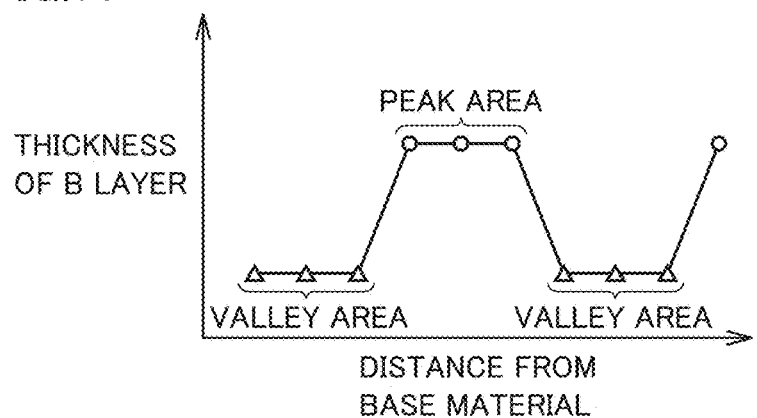
FIG. 11 is a graphic plot on a coordinate system having a vertical axis representing the thickness of each layer and having a horizontal axis representing the distance of each layer from the base material for B layers included in the super-multilayer-structure layer of FIG. 9.
Figure 12:
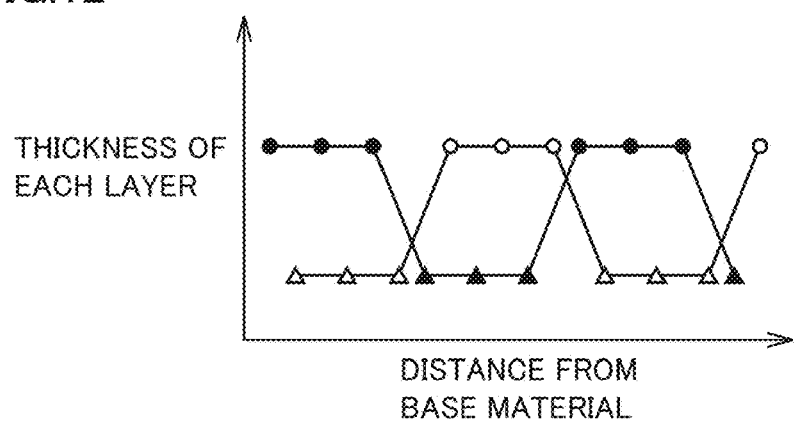
FIG. 12 is a graphic plot on a coordinate system having a vertical axis representing the thickness of each layer and having a horizontal axis representing the distance of each layer from the base material for A layers and B layers included in the super-multilayer-structure layer of FIG. 9.

The above (3) and (6) will be described. Graph A created for $A_1$ to $A_{10}$ layers shows a wavy pattern where a peak area and a valley area are alternately repeated as shown in FIG. 10. Further, graph B created for $B_1$ to $B_{10}$ layers shows a wavy pattern where a peak area and a valley area are alternately repeated as shown in FIG. 11. FIG. 12 is a graph obtained by superimposing FIG. 10 and FIG. 11 on each other.

In the above-described first super-multilayer-structure layer, as shown in FIG. 2 and FIG. 3, a "peak area" refers to an area where the thickness increases from an intermediate point to a local maximum point and then decreases to the next intermediate point, and a "valley area" refers to an area where the thickness decreases from an intermediate point to a local minimum point and then increases to the next intermediate point.

On the other hand, in the second super-multilayer-structure layer, as shown in FIG. 10 and FIG. 11, a "peak area" and a "valley area" in each graph are each constituted of layers having the same thickness. That is, graph A and graph B in the second embodiment is characterized by having a rectangular waveform, rather than having a sinusoidal waveform having local maximum points and local minimum points as in the first embodiment.

In tool 10 including a coating containing the second super-multilayer-structure layer, coating 2 can also exhibit many and various characteristics compared to a conventional one and allows for a remarkably long tool life for the same reasons described above.

<<More Preferred Embodiments of Super-Multilayer-Structure Layer>>

The first super-multilayer-structure layer and the second super-multilayer-structure layer have been described above as examples of a super-multilayer-structure layer according to this embodiment. More preferred embodiments of a super-multilayer-structure layer according to this embodiment are enumerated below.

In the super-multilayer-structure layer, an XY area composed of an X area and one Y area adjacent to the X area may have a thickness of, for example, 30 to 2500 nm. In particular, the thickness of the XY area is preferably less than or equal to 300 nm. In such a case, the interlayer peeling in the super-multilayer-structure layer is more reliably prevented, thus allowing tool 10 to have a further longer life. Although the reason for this is not exactly known, a conceivable reason is that such a thickness tends to reduce differences in residual stress between the areas.

In the super-multilayer-structure layer, an XY area composed of an X area and one Y area adjacent to the X area may include, for example, 3 to 15 A layers and 3 to 15 B layers. In particular, the XY area preferably includes 4 to 10 A layers and 4 to 10 B layers. The presence of four or more layers allows for a further gentle change in thickness of each layer in each area. On the other hand, the presence of more than ten layers, though making the change in thickness of each layer gentler, makes it difficult to control the structure of the super-multilayer-structure layer and may consequently cause uneven characteristics. Therefore, the XY area including 4 to 10 A layers and 4 to 10 B layers can more reliably prevent the interlayer peeling in the super-multilayer-structure layer, thus allowing tool 10 to have a further longer life.

In the super-multilayer-structure layer, each of A layers and B layers may have a thickness of, for example, 0.5 to 100 nm. In particular, each of A layers and B layers preferably has a thickness of 0.5 to 30 nm. In the super-multilayer-structure layer composed of A layers and B layers having such a thickness can more reliably prevent the interlayer peeling.

The super-multilayer-structure layer preferably has a thickness of 1 to 20 μm. A super-multilayer-structure layer having a thickness of less than 1 μm may not be able to sufficiently exhibit the effects of the super-multilayer-structure layer. A super-multilayer-structure layer having a thickness of more than 20 μm may cause peeling of the super-multilayer-structure layer due to a great pressure applied during cutting.

In the super-multilayer-structure layer, each A layer is preferably a compound layer containing Al, Cr, and N, and each B layer is preferably a compound layer containing Al, Ti, Si, and N. Such A layers tend to have good oxidation resistance in particular, and such B layers tend to have high hardness in particular. Oxidation resistance and hardness are characteristics closely related to the life of a cutting tool. In other words, a coating including a super-multilayer-structure layer composed of such A layers and B layers will allow tool 10 to have a particularly long tool life.

The super-multilayer-structure layer preferably has a hardness H of 35 GPa or more and the ratio H/E of hardness H to Young's modulus E is preferably 0.5 or more. Such a super-multilayer-structure layer has better abrasion resistance as well as breaking strength. Accordingly, it can exhibit particularly high performance during cutting of a difficult-to-cut material, such as a heat-resistant alloy.

Hardness H and Young's modulus E of the super-multilayer-structure layer can be obtained based on the nanoindentation technique in ISO 14577-1:2015.

Specifically, hardness H and Young's modulus E are obtained by indenting an indenter with a load controlled so that the indentation depth in a surface of the super-multilayer-structure layer will be 0.2 μm. Examples of ultra-micro indentation hardness testers to which the nanoindentation technique is applicable include "ENT-1100a" manufactured by ELIONIX Inc. With the presence of another layer (e.g. surface layer) on the super-multilayer-structure layer, the super-multilayer-structure layer is exposed through, for example, calotest and diagonal wrapping.

Although the upper limit value of hardness H of the super-multilayer-structure layer is not particularly limited, it is preferably less than or equal to 45 GPa from a viewpoint of improvement in resistance to chipping. Further, ratio H/E is preferably less than or equal to 0.12 from a viewpoint of consistency with the elastic deformation characteristics of the base material.

<Method of Manufacturing Surface-Coated Cutting Tool>

A surface-coated cutting tool including a coating containing the above-described super-multilayer-structure layer can be manufactured by the following method. The manufacturing method includes a step of preparing at least a base material and a step of forming a coating.

<<Step of Preparing Base Material>>

In this step, a base material is prepared. A base material composed of a cemented carbide, for example, may be prepared by common powder metallurgy. First, a WC powder and a Co powder, for example, are mixed by a ball mill to produce a mixture powder. Then, the mixture powder is dried and is then formed into a predetermined shape to produce a compact. The compact is then sintered to produce a WC-Co based cemented carbide (sintered body). The sintered body is then subjected to predetermined cutting edge machining, such as honing, as needed to prepare a base material composed of a WC-Co based cemented carbide.

<<Step of Forming Coating>>

In this step, a coating is formed by a PVD method. Examples of PVD methods include arc ion plating (AIP), balanced magnetron sputtering, and unbalanced magnetron sputtering. From a viewpoint of ease of manufacturability of a super-multilayer-structure layer, the use of the AIP method is preferred.

Figure 13:
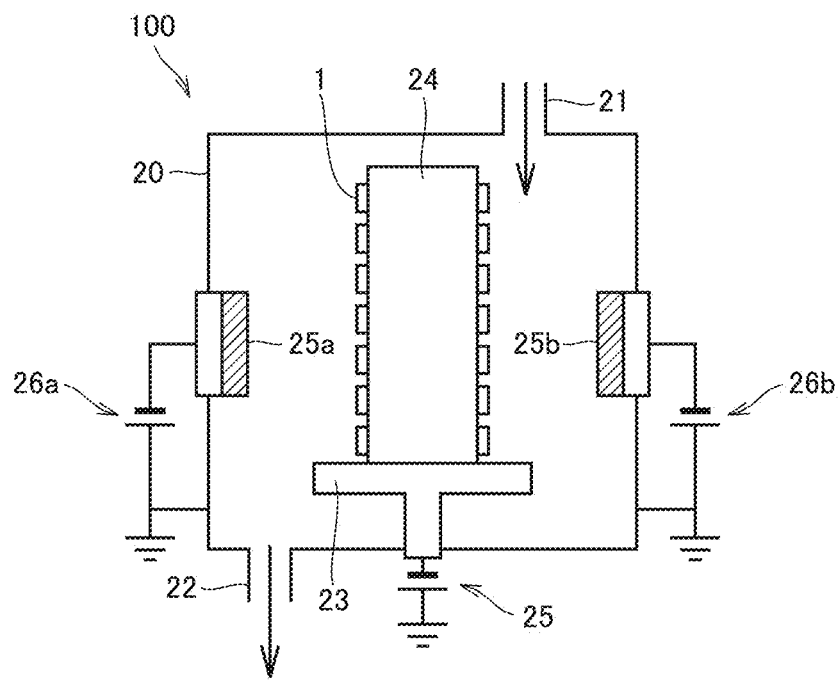
FIG. 13 is a schematic side perspective view showing one example configuration of a deposition apparatus that can be used for an AIP method.
Figure 14:
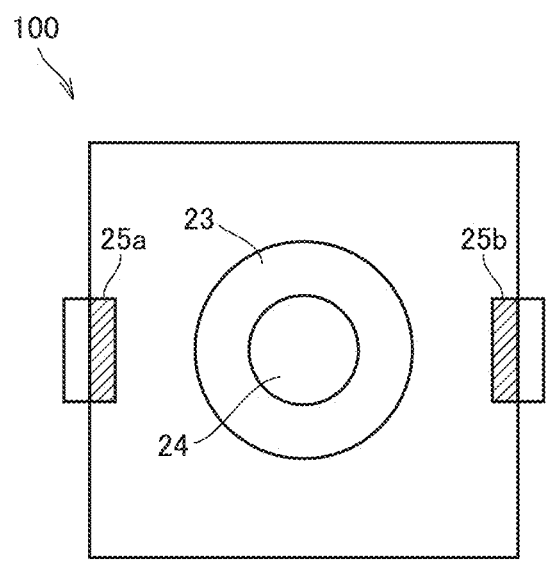
FIG. 14 is a schematic plan perspective view of the deposition apparatus of FIG. 13.

With reference to FIG. 13 and FIG. 14, a deposition apparatus used for the AIP method is described. A deposition apparatus 100 shown in FIG. 13 and FIG. 14 includes a chamber 20, a gas inlet 21 for introducing a source gas into chamber 20, and a gas outlet 22 for discharging the source gas to the outside. Chamber 20 is connected to a vacuum pump (not shown) and is configured to adjust the pressure in chamber 20 through gas outlet 22.

In chamber 20, a rotary table 23 is provided. To rotary table 23, a base material holder 24 for holding base material 1 is attached. Base material holder 24 is electrically connected to the negative electrode of a bias power supply 25. The positive electrode of bias power supply 25 is grounded and is also electrically connected to chamber 20.

Further, arc evaporation sources (targets 25a, 25b) are attached to the side walls of chamber 20, the arc evaporation sources being metal raw material of each layer constituting a coating. The arc evaporation sources are connected to the respective negative electrodes of DC power supplies 26a, 26b (which are variable power supplies). The positive electrodes of DC power supplies 26a, 26b are grounded.

In the deposition of a coating with the above-described deposition apparatus 100, layers other than a super-multilayer-structure layer, such as a primary layer and a surface layer, are formed in the following way. First, base material 1 is attached to base material holder 24 in deposition apparatus 100. Then, the pressure in chamber 20 is reduced by a vacuum pump (e.g. about $1.0 \times 10^{-4}$ Pa). Further, base material 1 is heated by a heater (not shown) provided in deposition apparatus 100 while rotating rotary table 23 at a constant speed.

After the temperature of base material 1 has sufficiently risen, a bias voltage is applied to base material 1 while introducing a reactive gas through gas inlet 21, the reactive gas containing a nonmetallic element (C, N, B, or O) among the atoms that constitute the layer. Further, an identical and constant arc current is supplied to targets 25a, 25b. Targets 25a, 25b are a reactive gas containing a metallic element among the atoms that constitute the layer. For a surface layer to have a larger lattice constant than a super-multilayer-structure layer, a bias voltage applied to base material 1 may be made smaller during deposition of the surface layer than during deposition of the super-multilayer-structure layer, for example. In this way, layers other than a super-multilayer-structure layer, such as a primary layer and a surface layer, are formed.

It is preferred that an ion bombardment be performed on a surface of the base material prior to formation of a coating. This is because the ion bombardment can clean the base material surface and can enhance the homogeneity of a coating to be formed on the base material surface. The AIP method allows this process to be easily performed.

On the other hand, a method of manufacturing a super-multilayer-structure layer of a coating is significantly different from the above method in that an arc current to be supplied to targets 25a, 25b is changed. As a reactive gas, a gas containing C and/or N is used.

Specifically, if target 25a is a metal raw material containing a metallic element that constitutes A layers and target 25b is a metal raw material containing a metallic element that constitutes B layers, then a current to be supplied to target 25a is changed over time to correspond a change in thickness of A layer, and a current to be supplied to target 25b is changed over time to correspond a change in thickness of B layer.

An A layer deposited with a high current supplied to target 25a is thick, whereas an A layer deposited with a low current supplied to target 25a is thin. Similarly, a B layer deposited with a high current supplied to target 25b is thick, whereas a B layer deposited with a low current supplied to target 25b is thin.

That is, for the deposition of the first super-multilayer-structure layer shown in FIG. 1 to FIG. 4, the magnitude of current to be supplied to target 25a is changed to correspond to the graph shown in FIG. 2, and the magnitude of current to be supplied to target 25b is changed to correspond to the graph shown in FIG. 3. For the deposition of the second super-multilayer-structure layer shown in FIG. 9 to FIG. 12, the magnitude of current to be supplied to target 25a is changed to correspond to the graph shown in FIG. 10, and the magnitude of current to be supplied to target 25b is changed to correspond to the graph shown in FIG. 11.

In this way, the thickness of each layer that constitutes a super-multilayer-structure layer can be controlled by controlling the magnitude of current to be supplied to each target. The overall thickness of a layer to be formed can be increased by slowing down the speed of rotation of the rotary table. The number of times each layer is deposited and the thickness of the super-multilayer-structure layer can be controlled by adjusting the processing time. Further, the number of A layers and B layers included in each XY area can be controlled by adjusting the current supplying time. In this way, the super-multilayer-structure layer is formed.

The above description describes a deposition method for deposition apparatus 100 having a monoaxial rotation mechanism. In the case of deposition apparatus 100 having a triaxial rotation mechanism, for example, the thickness of each layer that constitutes the super-multilayer-structure layer can be controlled by adjusting each rotational period of the triaxial rotation mechanism.

EXAMPLES

The present invention will be described in more detail below with Examples. The present invention, however, is not limited to the Examples. The surface-coated cutting tools of No. 1 to No. 9 each include the above-described second super-multilayer-structure layer. No. 10 to No. 18 are comparative examples. The surface-coated cutting tools of No. 19 to No. 50 each include the above-described first super-multilayer-structure layer.

<Method of Checking Characteristics>

The thickness of each layer constituting the super-multilayer-structure layer was obtained from the intensity profile of Z contrast obtained from a HAADF image. Further, graph A and graph B were created based on the thickness of each layer, and the information (such as the number of A layers and B layers constituting each X area and each Y area, and the thickness of each XY area) obtained from each graph was checked. The composition of each layer was checked by analyzing the HAADF image using EDX equipment incidental to a TEM as in the above-described method.

<Examination 1: No. 1 to No. 18>
<<Manufacture of No. 1 Surface-coated Cutting Tool>>

As a base material, a drill (made of cemented carbide (JIS K10), shape: MDW0800HGS5) having an external diameter of 8 mm was prepared. The base material was then placed in chamber 20 of deposition apparatus 100 having a monoaxial rotation mechanism shown in FIG. 13 and chamber 20 was vacuumed. After that, the base material was heated to 500° C. while rotary table 23 was rotated at 3 rpm. Ar gas was then introduced into vacuum chamber 20 at 1 Pa, a tungsten filament was electrically discharged to generate Ar ion, and a bias voltage of −500 V was applied to the base material. Thus, an ion bombardment of the tool base material using Ar ion was performed.

Then, a No. 1 super-multilayer-structure layer was deposited on a surface of the base material after etching. The features of No. 1 super-multilayer-structure layer are shown in Table 1.

TABLE 1

| | A layer | | | B layer | | | XY area | | | Super-multilayer-structure layer |
|---|---|---|---|---|---|---|---|---|---|---|
| | Composition | Thickness $A_X$ (nm) | Thickness $A_Y$ (nm) | Composition | Thickness $B_X$ (nm) | Thickness $B_Y$ (nm) | Thickness (nm) | Number of A layers | Number of B layers | Thickness (μm) |
| No.1 | $Al_{0.7}Cr_{0.3}N$ | 48 | 36 | $Ti_{0.5}Al_{0.5}N$ | 57 | 71 | 1590 | 15 | 15 | 4.8 |
| No.2 | $Al_{0.67}Ti_{0.33}N$ | 63 | 49 | $Ti_{0.5}Al_{0.5}N$ | 53 | 69 | 1760 | 15 | 15 | 5.3 |
| No.3 | $Ti_{0.5}Al_{0.5}N$ | 70 | 53 | $Ti_{0.9}Si_{0.1}N$ | 55 | 68 | 1850 | 15 | 15 | 5.5 |
| No.4 | $Ti_{0.5}Al_{0.5}N$ | 73 | 58 | $Ti_{0.9}Nb_{0.1}N$ | 58 | 75 | 1980 | 15 | 15 | 5.9 |
| No.5 | $Ti_{0.5}Al_{0.5}N$ | 72 | 54 | $Ti_{0.9}Ta_{0.1}N$ | 51 | 72 | 1870 | 15 | 15 | 5.6 |
| No.6 | $Ti_{0.5}Al_{0.5}N$ | 75 | 55 | $Ti_{0.9}W_{0.1}N$ | 48 | 69 | 1850 | 15 | 15 | 5.5 |
| No.7 | $Al_{0.7}Cr_{0.3}N$ | 74 | 55 | $Al_{0.58}Ti_{0.38}Si_{0.04}N$ | 67 | 90 | 2150 | 15 | 15 | 4.3 |
| No.8 | $Al_{0.7}Cr_{0.3}N$ | 72 | 54 | $Ti_{0.48}Al_{0.48}Si_{0.04}N$ | 62 | 86 | 2060 | 15 | 15 | 4.1 |
| No.9 | $Al_{0.7}Cr_{0.3}N$ | 73 | 57 | $Ti_{0.58}Al_{0.38}Si_{0.04}N$ | 56 | 79 | 1990 | 15 | 15 | 4.0 |

As shown in Table 1, No. 1 super-multilayer-structure layer had a construction in which an X area and a Y area were alternately repeated from the base material side to the surface side, the X area being an area where A layers having a thickness of 48 nm (thickness $A_X$) and B layers having a thickness of 57 nm (thickness $B_X$) were alternately laminated, the Y area being an area where A layers having a thickness of 36 nm (thickness $A_Y$) and B layers having a thickness of 71 nm (thickness $B_Y$) were alternately laminated. The composition of A layers was $Al_{0.7}Cr_{0.3}N$, and the composition of B layers was $Ti_{0.5}Al_{0.5}N$. The thickness of each XY area was 1590 nm, the number of A layers included in each XY area was 15, and the number of B layers included in each XY area was 15. The deposition conditions for this super-multilayer-structure layer are shown below.

Target A: Al (70 at %) and Cr (30 at %)
Target B: Ti (50 at %) and Al (50 at %)
Introduced gas: $N_2$
Deposition pressure: 6.0 Pa
Current supply to target A: Repeat step of supplying 150 A for 60 s ($A_X$ step) and subsequent step of supplying 150 A for 45 s ($A_Y$ step)
Current supply to target B: Repeat step of supplying 150 A for 65 s ($B_X$ step) and subsequent step of supplying 150 A for 80 s ($B_Y$ step)
Substrate bias voltage: 50 V
Table rotation rate: 2 rpm
Processing time: 90 min Control was performed so that, when the arc current supply to target A was $A_X$ step, the arc current supply to target B was $B_X$ step; and so that, when the arc current supply to target A was $A_Y$ step, the arc current supply to target B was $B_Y$ step. A layers having thickness $A_X$ were formed by $A_X$ step, A layers having thickness $A_Y$ were formed by $A_Y$ step, B layers having thickness $B_X$ were formed by $B_X$ step, and B layers having thickness $B_Y$ were formed by $B_Y$ step.

<<Manufacture of No. 2 to No. 9 Surface-Coated Cutting Tools>>

No. 2 to No. 9 surface-coated cutting tools were manufactured in the same way as No. 1 except that the constructions of the super-multilayer-structure layers were changed as shown in Table 1 by changing the deposition conditions of the super-multilayer-structure layers.

Specifically, thickness $A_X$ of A layers to constitute X areas, thickness $A_Y$ of A layers to constitute Y areas, thickness $B_X$ of B layers to constitute X areas, and thickness $B_Y$ of B layers to constitute Y areas were adjusted by increasing and decreasing the magnitude of the arc current in each of $A_X$ step, $A_Y$ step, $B_X$ step, and $B_Y$ step. Note that a greater arc current makes each layer thicker, and that a smaller arc current makes each layer thinner.

The number of A layers to constitute each X area, the number of A layers to constitute each Y area, the number of B layers to constitute each X area, and the number of B layers to constitute each Y area were adjusted by increasing and decreasing the period of time of each of $A_X$ step, $A_Y$ step, $B_X$ step, and $B_Y$ step. Note that a longer supply time makes the number of layers larger, and that a shorter supply time makes the number of layers smaller.

<<Manufacture of No. 10 to No. 18 Surface-Coated Cutting Tools>>

Using the same base material as that of No. 1, No. 10 to No. 18 surface-coated cutting tools were manufactured in the same way as No. 1 except that the layers shown in Table 2, instead of super-multilayer-structure layers, were formed on surfaces of base materials.

TABLE 2

| | A layer | | B layer | | Entire layer |
|---|---|---|---|---|---|
| | Composition | Thickness (nm) | Composition | Thickness (nm) | Thickness (μm) |
| No. 10 | $Ti_{0.5}Al_{0.5}N$ | — | — | — | 4 |
| No. 11 | $Al_{0.7}Cr_{0.3}N$ | — | — | — | 4 |
| No. 12 | $Al_{0.58}Ti_{0.38}Si_{0.04}N$ | — | — | — | 4 |
| No. 13 | $Ti_{0.48}Al_{0.48}Si_{0.04}N$ | — | — | — | 4 |
| No. 14 | $Ti_{0.58}Al_{0.38}Si_{0.04}N$ | — | — | — | 4 |
| No. 15 | $Al_{0.7}Cr_{0.3}N$ | 10 | $Ti_{0.5}Al_{0.5}N$ | 10 | 4 |
| No. 16 | $Al_{0.7}Cr_{0.3}N$ | 10 | $Al_{0.58}Ti_{0.38}Si_{0.04}N$ | 10 | 4 |
| No. 17 | $Al_{0.7}Cr_{0.3}N$ | 10 | $Ti_{0.48}Al_{0.48}Si_{0.04}N$ | 10 | 4 |
| No. 18 | $Al_{0.7}Cr_{0.3}N$ | 10 | $Ti_{0.58}Al_{0.38}Si_{0.04}N$ | 10 | 4 |

Specifically, for No. 10 to No. 14, target A and target B had the same composition, and target A and target B were continuously supplied with the same-magnitude arc current (150 A). For No. 15 to No. 18, on the other hand, target A composed of metallic element to constitute each A layer and target B composed of metallic element to constitute each B layer were used, and target A and target B were continuously supplied with the same-magnitude arc current (150 A).

<<Test 1>>

Drilling tests were conducted with No. 1 to No. 18 surface-coated cutting tools under the following conditions. Each time 100 holes were newly drilled, the accuracy of dimension of the last-drilled hole was checked, and if the accuracy of dimension was outside of a prescribed range, the life of the surface-coated cutting tool was determined to be exhausted and the test was stopped. Table 3 shows the number of holes that each surface-coated cutting tool was able to make. The larger number of holes shows that the tool was able to drill a larger number of holes with prescribed accuracy of dimension and that the tool life was longer. Note that the prescribed range was 8.000 to 8.036 mm.

Workpiece: S50C (HB200)
Cutting speed: 70 m/min
Feed rate: 0.25 mm/rev
Hole depth: 24 mm blind-hole
Cutting oil: With cutting oil (externally supplied oil)

<<Test 2>>

Drilling tests were conducted with No. 1 to No. 18 surface-coated cutting tools under the following conditions. Each time 100 holes were newly drilled, the accuracy of dimension of the last-drilled hole was checked, and if the accuracy of dimension was outside of a prescribed range, the life of the surface-coated cutting tool was determined to be exhausted and the test was stopped. Table 3 shows the number of holes that each surface-coated cutting tool was able to make. The larger number of holes shows that the tool was able to drill a larger number of holes with prescribed accuracy of dimension and that the tool life was longer. Note that the prescribed range was 8.000 to 8.036 mm.

Workpiece: SCM415 (HB120)
Cutting speed: 60 m/min
Feed rate: 0.18 mm/rev
Hole depth: 18 mm blind-hole
Cutting oil: With cutting oil (externally supplied oil)

TABLE 3

|  | Test 1 Number of holes | Test 2 Number of holes |
| --- | --- | --- |
| No. 1 | 4000 | 5600 |
| No. 2 | 4000 | 5600 |
| No. 3 | 4000 | 5600 |
| No. 4 | 4200 | 5900 |
| No. 5 | 4300 | 6000 |
| No. 6 | 4300 | 6000 |
| No. 7 | 5000 | 7300 |
| No. 8 | 5100 | 7100 |
| No. 9 | 5200 | 7000 |
| No. 10 | 500 | 700 |
| No. 11 | 600 | 800 |
| No. 12 | 700 | 1000 |
| No. 13 | 800 | 1100 |
| No. 14 | 900 | 1300 |
| No. 15 | 1500 | 2100 |
| No. 16 | 1700 | 2800 |
| No. 17 | 1800 | 2500 |
| No. 18 | 2000 | 2400 |

<<Characteristics Evaluation>>

As shown in Table 3, it was confirmed that No. 1 to No. 9 surface-coated cutting tools had longer tool lives than No. 10 to No. 18 surface-coated cutting tools. Above all, No. 7 to No. 9 presented particularly long tool lives. This was thought to be related to the fact that the A layers were AlCrN layers exhibiting high oxidation resistance and that the B layers were AlTiSiN layers exhibiting high hardness.

<Examination 2: No. 19 to No. 50>

<<Manufacture of No. 19 Surface-coated Cutting Tool>>

No. 19 to No. 50 surface-coated cutting tools were manufactured in the same way as No. 1 except that the constructions of the super-multilayer-structure layers were changed as shown in Table 4 by changing the deposition conditions of the super-multilayer-structure layers.

Target A: Al (70 at %) and Cr (30 at %)
Target B: Al (58 at %), Ti (38 at %), and Si (4 at %)
Introduced gas: $N_2$
Deposition pressure: 6.0 Pa
Current supply to target A: Repeat step of increasing from 100 A to 200 A at a speed of 20 A/min and then decreasing to 100 A at the same speed ($A_X$ step), and step of decreasing from 200 A to 100 A at a speed of 20 A/min and then increasing to 200 A at the same speed ($A_Y$ step)
Current supply to target B: Repeat step of decreasing from 180 A to 120 A at a speed of 12 A/min and then increasing to 180 A at the same speed ($B_X$ step), and step of increasing from 120 A to 180 A at a speed of 12 A/min and then decreasing to 120 A at the same speed ($B_Y$ step)
Substrate bias voltage: 30 V
Table rotation rate: 2 rpm
Processing time: 80 min Control was performed so that, when the arc current supply to target A was $A_X$ step, the arc current supply to target B was $B_X$ step; and so that, when the arc current supply to target A was $A_Y$ step, the arc current supply to target B was $B_Y$ step. A layers having thickness $A_X$ were formed by $A_X$ step, A layers having thickness $A_Y$ were formed by $A_Y$ step, B layers having thickness $B_X$ were formed by $B_X$ step, and B layers having thickness $B_Y$ were formed by $B_Y$ step.

The manufacture conditions of No. 19 super-multilayer-structure layer are significantly different from those of No. 1 super-multilayer-structure layer in that each arc current to be supplied to target A and target B repeats a continuous increase and a continuous decrease. Accordingly, in No. 19 super-multilayer-structure layer, the thickness of A layer and the thickness of B layer continuously increase and decrease from the base material side to the surface side. In addition, in the area where the thickness of A layer continuously increases, the thickness of B layer continuously decreases, whereas in the area where the thickness of A layer continuously decreases, the thickness of B layer continuously increases.

In No. 19 super-multilayer-structure layer, thickness $A_X$, thickness $A_Y$, thickness $B_X$, and thickness $B_Y$ each have a plurality of thicknesses. However, Table 4 shows only the maximum value of thickness $A_X$ (i.e., the value of a local maximum point of graph A), the minimum value of thickness $A_Y$ (i.e., the value of a local minimum point of graph A), the minimum value of thickness $B_X$ (i.e., the value of a local minimum point of graph B), and the maximum value of thickness $B_Y$ (i.e., the value of a local maximum point of graph B).

<<Manufacture of No. 20 to No. 50 Surface-coated Cutting Tools>>

No. 20 to No. 50 surface-coated cutting tools were manufactured in the same way as No. 9 except that the constructions of the super-multilayer-structure layers were changed as shown in Table 4 and Table 5 by changing the deposition conditions of the super-multilayer-structure layers.

Specifically, the maximum value of thickness $A_X$ of A layers to constitute each X area, the minimum value of thickness $A_Y$ of A layers to constitute each Y area, the maximum value of thickness $B_X$ of B layers to constitute each X area, and the minimum value of thickness $B_Y$ of B layers to constitute each Y area were adjusted by increasing and decreasing the maximum value and the minimum value of the magnitude of the arc current in each of $A_X$ step, $A_Y$ step, $B_X$ step, and $B_Y$ step.

The number of A layers to constitute each X area, the number of A layers to constitute each Y area, the number of B layers to constitute each X area, and the number of B layers to constitute each Y area were adjusted by increasing and decreasing the period of time of each of $A_X$ step, $A_Y$ step, $B_X$ step, and $B_Y$ step.

TABLE 4

| | A layer | | | B layer | | | | XY area | | Super-multilayer-structure layer |
|---|---|---|---|---|---|---|---|---|---|---|
| | Composition | Maximum value of thickness $A_X$ (nm) | Minimum value of thickness $A_Y$ (nm) | Composition | Minimum value of thickness $B_X$ (nm) | Maximum value of thickness $B_Y$ (nm) | Thickness (nm) | Number of A layers | Number of B layers | Thickness (μm) |
| No.19 | $Al_{0.7}Cr_{0.3}N$ | 76 | 35 | $Al_{0.58}Ti_{0.38}Si_{0.04}N$ | 66 | 91 | 2010 | 15 | 15 | 4.0 |
| No.20 | | 70 | 31 | $Ti_{0.48}Al_{0.48}Si_{0.04}N$ | 59 | 83 | 1820 | 15 | 15 | 3.6 |
| No.21 | | 72 | 33 | $Ti_{0.58}Al_{0.38}Si_{0.04}N$ | 54 | 76 | 1760 | 15 | 15 | 3.5 |
| No.22 | | 55 | 35 | $Al_{0.58}Ti_{0.38}Si_{0.04}N$ | 36 | 65 | 290 | 3 | 3 | 4.1 |
| No.23 | | 40 | 31 | $Al_{0.58}Ti_{0.38}Si_{0.04}N$ | 31 | 41 | 210 | 3 | 3 | 4.2 |
| No.24 | | 39 | 31 | $Ti_{0.48}Al_{0.48}Si_{0.04}N$ | 33 | 48 | 230 | 3 | 3 | 4.1 |
| No.25 | | 42 | 33 | $Al_{0.58}Ti_{0.38}Si_{0.04}N$ | 31 | 45 | 230 | 3 | 3 | 4.1 |
| No.26 | | 15 | 12 | $Ti_{0.58}Al_{0.38}Si_{0.04}N$ | 13 | 19 | 120 | 4 | 4 | 4.0 |
| No.27 | | 15 | 12 | | 13 | 19 | 180 | 6 | 6 | 4.0 |
| No.28 | | 15 | 12 | | 13 | 19 | 240 | 8 | 8 | 4.1 |
| No.29 | | 15 | 12 | | 13 | 19 | 300 | 10 | 10 | 3.9 |
| No.30 | | 12 | 9 | | 10 | 16 | 240 | 10 | 10 | 4.1 |
| No.31 | | 10 | 7 | | 8 | 13 | 190 | 10 | 10 | 4.2 |
| No.32 | | 7 | 4 | | 7 | 10 | 140 | 10 | 10 | 4.2 |
| No.33 | | 4.6 | 2.5 | | 4.1 | 6.4 | 88 | 10 | 10 | 4.2 |
| No.34 | | 2.9 | 1.5 | | 2.4 | 4.3 | 56 | 10 | 10 | 4.2 |
| No.35 | | 1.8 | 0.8 | | 0.9 | 2.6 | 31 | 10 | 10 | 4.2 |

TABLE 5

| | A layer | | | B layer | | | | XY area | | Super-multilayer-structure layer |
|---|---|---|---|---|---|---|---|---|---|---|
| | Composition | Maximum value of thickness $A_X$ (nm) | Minimum value of thickness $A_Y$ (nm) | Composition | Minimum value of thickness $B_X$ (nm) | Maximum value of thickness $B_Y$ (nm) | Thickness (nm) | Number of A layers | Number of B layers | Thickness (μm) |
| No.36 | $Al_{0.7}Cr_{0.3}N$ | 4.4 | 2.4 | $Ti_{0.48}Al_{0.48}Si_{0.04}N$ | 3.6 | 5.9 | 82 | 10 | 10 | 1.2 |
| No.37 | | 4.3 | 2.3 | $Al_{0.58}Ti_{0.38}Si_{0.04}N$ | 3.2 | 5.6 | 77 | | | 1.2 |
| No.38 | | | | | | | | | | 2.5 |
| No.39 | | | | | | | | | | 3.7 |
| No.40 | | | | | | | | | | 4.9 |
| No.41 | | | | | | | | | | 6.2 |
| No.42 | | | | | | | | | | 9.8 |
| No.43 | | | | | | | | | | 12.4 |
| No.44 | | | | | | | | | | 18.6 |
| No.45 | | 11 | 5.3 | $Ti_{0.5}Al_{0.5}N$ | 7.1 | 15 | 150 | 8 | 8 | 4.1 |
| No.46 | $Al_{0.67}Ti_{0.33}N$ | 14 | 6.8 | $Ti_{0.5}Al_{0.5}N$ | 9.3 | 18 | 190 | | | 4.2 |
| No.47 | $Ti_{0.5}Al_{0.5}N$ | 17 | 8.3 | $Ti_{0.9}Si_{0.1}N$ | 12 | 20 | 230 | | | 4.1 |
| No.48 | | 19 | 9.1 | $Ti_{0.9}Nb_{0.1}N$ | 13 | 25 | 260 | | | 4.2 |
| No.49 | | 16 | 7.5 | $Ti_{0.9}Ta_{0.1}N$ | 10 | 19 | 210 | | | 4.2 |
| No.50 | | 23 | 10.7 | $Ti_{0.9}W_{0.1}N$ | 11 | 20 | 260 | | | 4.2 |

<<Test 1 and Test 2>>

Test 1 and test 2 were conducted in a similar way to Examination 1. The results are shown in Table 6.

TABLE 6

|  | Test 1 Number of holes | Test 2 Number of holes |
|---|---|---|
| No. 19 | 5500 | 8100 |
| No. 20 | 5600 | 7800 |
| No. 21 | 5800 | 7700 |
| No. 22 | 6000 | 8600 |
| No. 23 | 6200 | 8800 |
| No. 24 | 6200 | 8600 |
| No. 25 | 6300 | 8400 |
| No. 26 | 7900 | 9800 |
| No. 27 | 8000 | 10400 |
| No. 28 | 8100 | 11200 |
| No. 29 | 8200 | 11200 |
| No. 30 | 8400 | 11400 |
| No. 31 | 8600 | 11600 |
| No. 32 | 8800 | 11800 |
| No. 33 | 9000 | 12000 |
| No. 34 | 8700 | 11700 |
| No. 35 | 8500 | 11500 |
| No. 36 | 7200 | 12500 |
| No. 37 | 7000 | 12800 |
| No. 38 | 7400 | 13000 |
| No. 39 | 8000 | 13300 |
| No. 40 | 8000 | 13500 |
| No. 41 | 7800 | 13300 |
| No. 42 | 7600 | 13000 |
| No. 43 | 7400 | 12800 |
| No. 44 | 7200 | 12800 |
| No. 45 | 6600 | 9200 |
| No. 46 | 6600 | 9200 |
| No. 47 | 6600 | 9200 |
| No. 48 | 6800 | 9500 |
| No. 49 | 6900 | 9600 |
| No. 50 | 6800 | 9500 |

<<Characteristics Evaluation>>

With reference to Table 4 and Table 6, from the results of No. 19 to No. 35, it was confirmed that the tool life was particularly long when the thickness of XY area was 30 to 300 nm. Further, No. 26 to No. 35 had longer tool lives than No. 19 to No. 25. From these results, it was confirmed that the preferable number of A layers and the preferable number of B layers included in each XY area were each 4 to 10, and that the preferable thickness of each of A layers and B layers was less than or equal to 30 nm, and more preferably less than or equal to 20 nm.

With reference to Table 5 and Table 6, from the results of No. 36 to No. 44, it was confirmed that the tool life was long when the thickness of super-multilayer-structure layer was 1 to 20 μm. As to No. 19 to No. 44, each A layer was a compound layer containing Al, Cr, and N, and each B layer was a compound layer containing Al, Ti, Si, and N. Such a case provides a particularly long tool life as already mentioned. However, it was also confirmed, from the results of No. 45 to No. 50, that a super-multilayer-structure layer including A layers and B layers having a composition other than such a composition can also provide a sufficiently long tool life.

It should be construed that the embodiments and examples disclosed herein are given by way of example in all respects, not by way of limitation. It is intended that the scope of the present invention is defined by claims, not by the above-described embodiments and examples, and encompasses all modifications equivalent in meaning and scope to the claims.

REFERENCE SIGNS LIST

1: base material; 2: coating; 10: surface-coated cutting tool; 20: chamber; 21: gas inlet; 22: gas outlet; 23: rotary table; 24: base material holder; 25a, 25b: target; 26a, 26b: arc evaporation source; 100: deposition apparatus

The invention claimed is:

1. A surface-coated cutting tool comprising:
a base material; and
a coating covering a surface of the base material,
the coating including a super-multilayer-structure layer where A layers and B layers different from the A layers in composition are alternately laminated from a base material side to a surface side,
the super-multilayer-structure layer having a construction in which an X area and a Y area are alternately repeated from the base material side to the surface side, the X area being an area where A layers having a thickness $A_X$ and B layers having a thickness $B_X$ are alternately laminated, the Y area being an area where A layers having a thickness $A_Y$ and B layers having a thickness $B_Y$ are alternately laminated,
the thickness $A_X$ of the A layers being larger than the thickness $A_Y$ of the A layers,
the thickness $B_X$ of the B layers being smaller than the thickness $B_Y$ of the B layers,
each of the A layers and the B layers having a composition comprising one or more elements selected from a group consisting of Ti, Al, Cr, Si, Ta, Nb, and W, and one or more elements selected from a group consisting of C and N,
each of the A layers being a compound layer consisting of Al, Cr, and N,
each of the B layers being a compound layer consisting of Al, Ti, Si, and N,
wherein an XY area composed of the X area and the one Y area adjacent to the X area has a thickness of more than or equal to 88 nm and less than or equal to 300 nm.

2. A surface-coated cutting tool comprising:
a base material; and
a coating covering a surface of the base material,
the coating including a super-multilayer-structure layer where A layers and B layers different from the A layers in composition are alternately laminated from a base material side to a surface side,
the super-multilayer-structure layer having a construction in which an X area and a Y area are alternately repeated from the base material side to the surface side, the X area being an area where A layers having a thickness $A_X$ and B layers having a thickness $B_X$ are alternately laminated, the Y area being an area where A layers having a thickness $A_Y$ and B layers having a thickness $B_Y$ are alternately laminated,
the thickness $A_X$ of the A layers being larger than the thickness $A_Y$ of the A layers,
the thickness $B_X$ of the B layers being smaller than the thickness $B_Y$ of the B layers,
each of the A layers and the B layers having a composition comprising one or more elements selected from a group consisting of Ti, Al, Cr, Si, Ta, Nb, and W, and one or more elements selected from a group consisting of C and N,
each of the A layers being a compound layer consisting of Al, Cr, and N,
each of the B layers being a compound layer consisting of Al, Ti, Si, and N, wherein on a coordinate system having a vertical axis representing a thickness and having a horizontal axis representing a distance from the base material for each layer constituting the super-multilayer-structure layer,
- a graph A obtained by putting plots of the A layers included in the super-multilayer-structure layer and by connecting the plots with a straight line shows an angular pattern where a peak area and a valley area are alternately repeated, and
- a graph B obtained by putting plots of the B layers included in the super-multilayer-structure layer and by connecting the plots with a straight line shows an angular pattern where a peak area and a valley area are alternately repeated, wherein
   - in the graph A, the A layers constituting the peak area are the A layers constituting the X area, and the A layers constituting the valley area are the A layers constituting the Y area,
   - in the graph B, the B layers constituting the peak area are the B layers constituting the Y area, and the B layers constituting the valley area are the B layers constituting the X area.

3. The surface-coated cutting tool according to claim 1, wherein the XY area composed of the X area and the one Y area adjacent to the X area includes 4 to 10 A layers both inclusive and 4 to 10 B layers both inclusive.

4. The surface-coated cutting tool according to claim 1, wherein each of the A layers and the B layers has a thickness of 0.5 nm to 30 nm both inclusive.

5. The surface-coated cutting tool according to claim 1, wherein the super-multilayer-structure layer has a thickness of 1 μm to 20 μm both inclusive.

6. The surface-coated cutting tool according to claim 2, wherein the XY area composed of the X area and the one Y area adjacent to the X area includes 4 to 10 A layers both inclusive and 4 to 10 B layers both inclusive.

7. The surface-coated cutting tool according to claim 2, wherein each of the A layers and the B layers has a thickness of 0.5 nm to 30 nm both inclusive.

8. The surface-coated cutting tool according to claim 2, wherein the super-multilayer-structure layer has a thickness of 1 μm to 20 μm both inclusive.

\* \* \* \* \*